United States Patent [19]
Younkin et al.

[11] 3,953,847
[45] Apr. 27, 1976

[54] POSITION ENCODER

[75] Inventors: James R. Younkin, Fayetteville; John M. Nixon, Springdale, both of Ark.

[73] Assignee: Edo-Aire Mitchell Industries, Inc., Mineral Wells, Tex.

[22] Filed: Mar. 25, 1974

[21] Appl. No.: 454,306

[52] U.S. Cl. .......................... 340/347 AD; 73/384; 244/180; 340/347 P
[51] Int. Cl.² ................................. H03K 13/18
[58] Field of Search ............. 340/347 AD, 347 P; 73/384; 244/77 D

[56] References Cited
UNITED STATES PATENTS

| | | | |
|---|---|---|---|
| 2,318,591 | 5/1943 | Couffignal | 235/61 |
| 2,793,807 | 5/1957 | Yaeger | 235/61 |
| 3,007,637 | 11/1961 | Meirowitz | 235/92 |
| 3,245,255 | 4/1966 | Parsons | 73/178 |
| 3,543,152 | 11/1970 | Niedereder | 324/99 |
| 3,626,748 | 12/1971 | Springer | 73/4 R |
| 3,693,405 | 9/1972 | Shimomura | 73/384 |

*Primary Examiner*—Malcolm A. Morrison
*Assistant Examiner*—Vincent J. Sunderdick
*Attorney, Agent, or Firm*—Richards, Harris & Medlock

[57] ABSTRACT

A pressure altitude signal actuates a servomotor coupled through a gear train to an altimeter that includes a rotational shaft for repositioning an aneroid pickoff. Mounted on the rotational shaft is an encoding disc with seven code formations supported on one face of the disc. Each code formation has a generally circular configuration with the various formations juxtapositioned. Six brush pickoffs respond to the six outermost code formations to provide pulse trains related to altitude pressure. A seventh brush pickoff provides a reference code to encoder logic that generates three additional pulse trains related to altitude pressure. The pulse trains of the outer six code formations and the pulse trains from the encoder logic uniquely identify by means of a code bit pattern an altitude.

21 Claims, 7 Drawing Figures

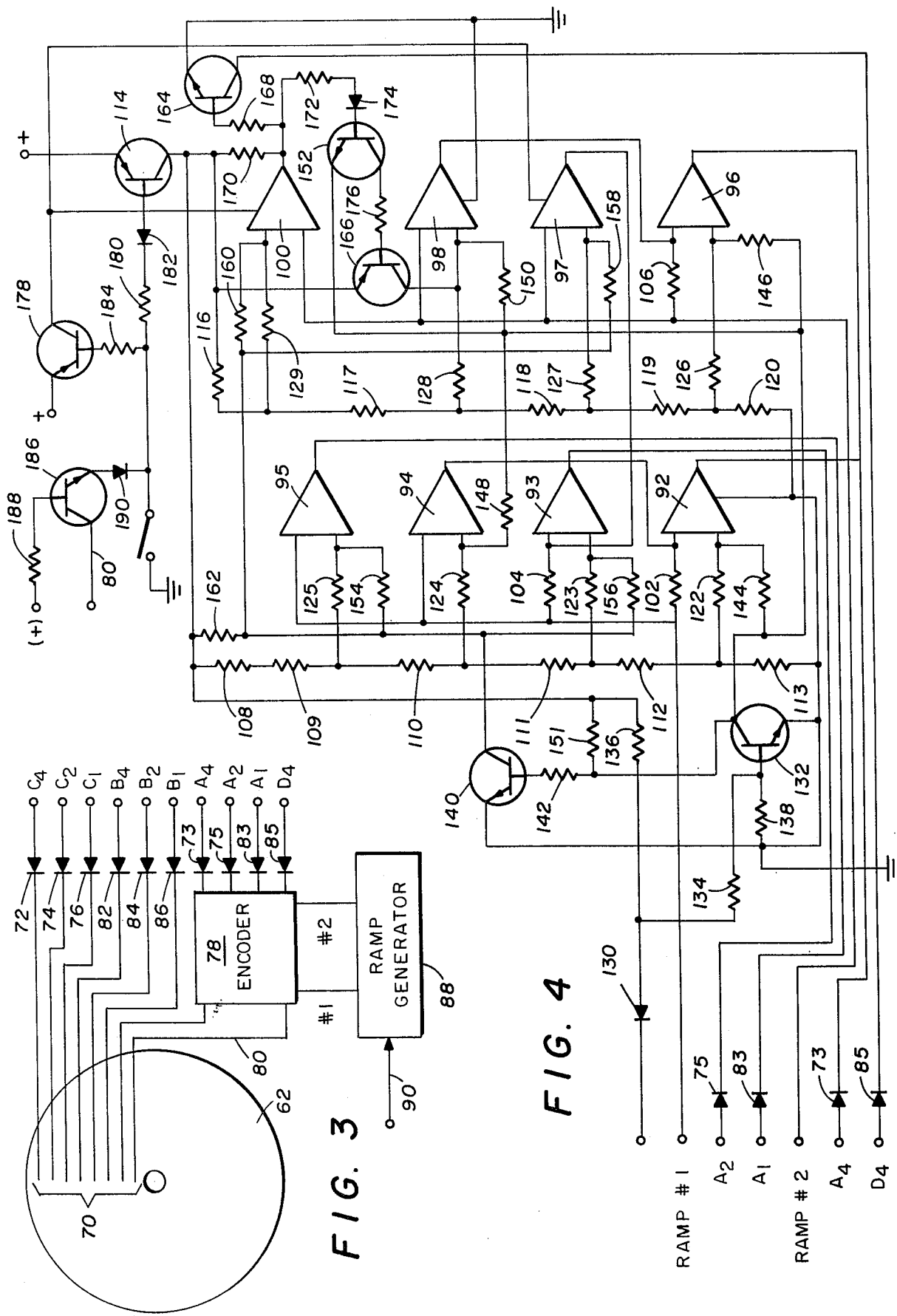

POSITION ENCODER

This invention relates to a position encoder, and more particularly to a position encoder utilizing encoder logic to extend the code range.

Aircraft altimeters usually consist of a housing containing pressure responsive means expandable and contractible in accordance with changes in ambient atmosphere and a signal generator operable thereby to provide aircraft altitude signals. These signals are coupled to a servo control system as part of an altitude indicator for pilot observation. In addition, pressure altitude signals are provided to an encoder for converting into a code bit pattern for application to a transponder for transmission to a ground station. Operation of the transponder transmits the encoded altitude indicated information to a ground station for continuous monitoring of aircraft altitude.

Heretofore, various devices for encoding the indicated altitude signals for transmission by the transponder have been provided. However, many of the arrangements furnishing such coded data have been of complicated and expensive construction and accordingly not suitable for small general aviation aircraft. In order to cover the altitude range required for most aircraft, complicated and sophisticated coding techniques have been proposed. The problem is to provide a unique code bit pattern for each increment of aircraft altitude.

Another problem often encountered with present day encoder systems is that of accurately generating an altitude code bit pattern that is repeatable for both an ascending and descending altitude change. Small errors that may individually not be significant accumulate in a complete system to significantly affect encoder accuracy. These errors may occur in the primary pickoff or in the processing electronics that provide the final encoded signals.

A feature of the present invention is to provide a position encoder having a code bit pattern uniquely identifying each increment of position. A code bit pattern identifying the lowest or next to lowest increments of positional change are provided directly from code formations on a positionable support. Incremental changes of higher significance are generated by encoding logic responsive to a reference code provided by a code formation also on the positionable support. The encoded data from the encoder logic and the encoded data from the code formations in combination uniquely defines a position of the support means.

Another feature of the present invention is to provide an altimeter encoder operational over the range of altitude normally encountered in the flight of an aircraft. Encoding logic providing coded data representing the most significant increments of altitude change is actuated by a reference code from a code formation on a rotating disc having a position directly related to altitude pressure change. To insure that each code bit pattern uniquely identifies a particular altitude over the range of flights of an aircraft, the encoder logic is provided with input signals from a generator responsive to aircraft altitude.

In accordance with one embodiment of the present invention, a position encoder includes a code support positionable in accordance with physical input information. A first group of a plurality of code formations is carried by the support, these code formations change at selected intervals of movement of the support. At least one additional group of a plurality of code formations is also carried by the support, again the code formations of these additional groups change at selected intervals of movement of the code support. Responsive to the code formations of the additional groups of such formations is circuit means having outputs providing a first series of bit patterns that change in accordance with the input information. The first group of code formations provides an input to encoder logic that provides a second series of bit patterns that also change in accordance with the input information. The bit patterns of both the circuit means and the encoder logic uniquely identifies physical input information when combined into a total code bit pattern.

In accordance with an altimeter encoder embodiment of the present invention, the code support comprises a circular disc rotatable by a servomotor responsive to an altitude pressure signal. The additional group of code formations provides voltage pulse trains through circuitry to define the lowest and next to least significant increments of altitude change. The first group of code formations on the rotating disc provides a signal to encoder logic that also responds to the output of a ramp generator, where the generator output varies with altitude pressure.

A more complete understanding of the invention and its advantages will be apparent from the specification and claims and from the accompanying drawings illustrative of the invention.

Referring to the drawings:

FIG. 3 is a schematic of an altitude encoder providing a 10 bit code pattern that uniquely identifies an altitude;

FIG. 4 is a schematic of the encoder logic of FIG. 3 for providing the most significant increments of the code bit pattern from the system of FIG. 3;

It will be understood that the invention herein described is not limited to altitude encoders, but finds general application to generate a code representing an analog input signal.

Figure 1:
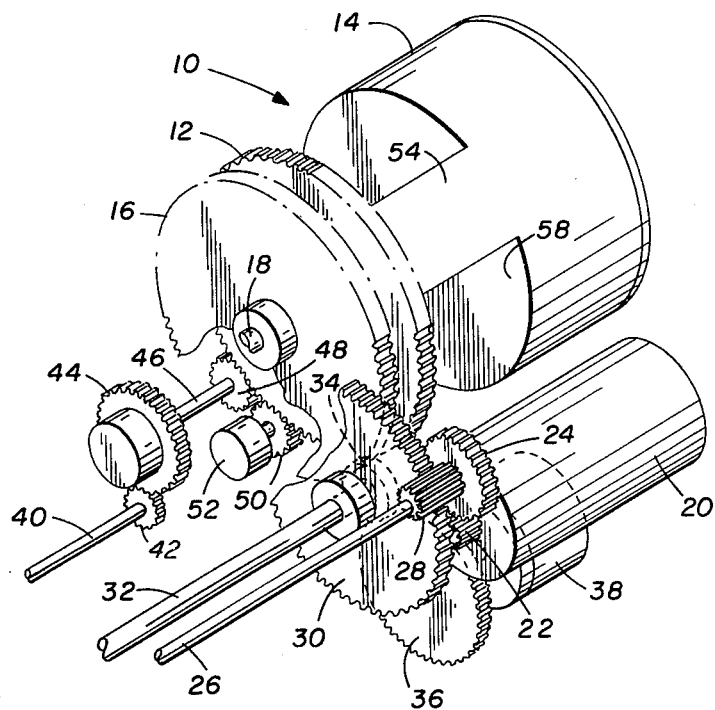
FIG. 1 is a pictorial of an altimeter including a set point adjusting gear train and a servomotor feedback and having an encoding disc in accordance with the present invention.

Referring to FIG. 1, there is shown an altitude responsive system of the type utilized in a flight instrument as described in the copending application of James R. Younkin, filed Mar. 25, 1974, Ser. No. 454,305. The pressure responsive system includes an altimeter 10 having a ring gear 12 as part of an altimeter housing 14. A drive gear 16 mounted to a rotational shaft 18 also comprises part of the altimeter 10.

The drive gear 16 is driven by a servomotor 20 coupled to an altitude control system. On the output shaft of the servomotor 20 there is mounted a spur gear 22 that engages a drive gear 24 mounted on a shaft 26 that drives a digital display, not shown. Also mounted on the shaft 26 is a spur gear 28 engaging a drive gear 30 mounted on a shaft 32. The shaft 32 also drives an aircraft altitude indicator. Also driven by the drive gear 30 is an idler gear 34 engaging the drive gear 16 and in engagement with a drive gear 36 coupled to the shaft of a potentiometer 38. The potentiometer 38 is a part of the altitude control system of the copending application of James R. Younkin.

Energization of the altitude servomotor 20 by a signal from the altitude control system causes the drive gear 16 to rotate the shaft 18 of the altimeter 10. A signal to the servomotor 20 also rotates the shafts 26 and 32 to drive altitude indicating displays.

As an aircraft covers a given course the pressure at gournd level changes due to local atmospheric conditions. To reference the altimeter 10 to a particular ground barometric level pressure, an adjusting knob (not shown) couples to a drive shaft 40 on which is mounted a spur gear 42 engaging a drive gear 44 mounted on a shaft 46. A spur gear 48 is also mounted on the shaft 46 and engages the ring gear 12 coupled to the housing 14 of the altimeter 10. Thus, the housing 10 is rotatably mounted with respect to the shaft 18 to adjust the indicated altitude set point of the altimeter. This establishes a predetermined relationship between a pickoff and an aneroid, to be described, of the altimeter 10.

Also rotating with the ring gear 12 is a spur gear 50 coupled to the wiper arm of the potentiometer 52 as part of a compensation network for the altimeter 10, as described in the copending application of James R. Younkin.

Figure 2:
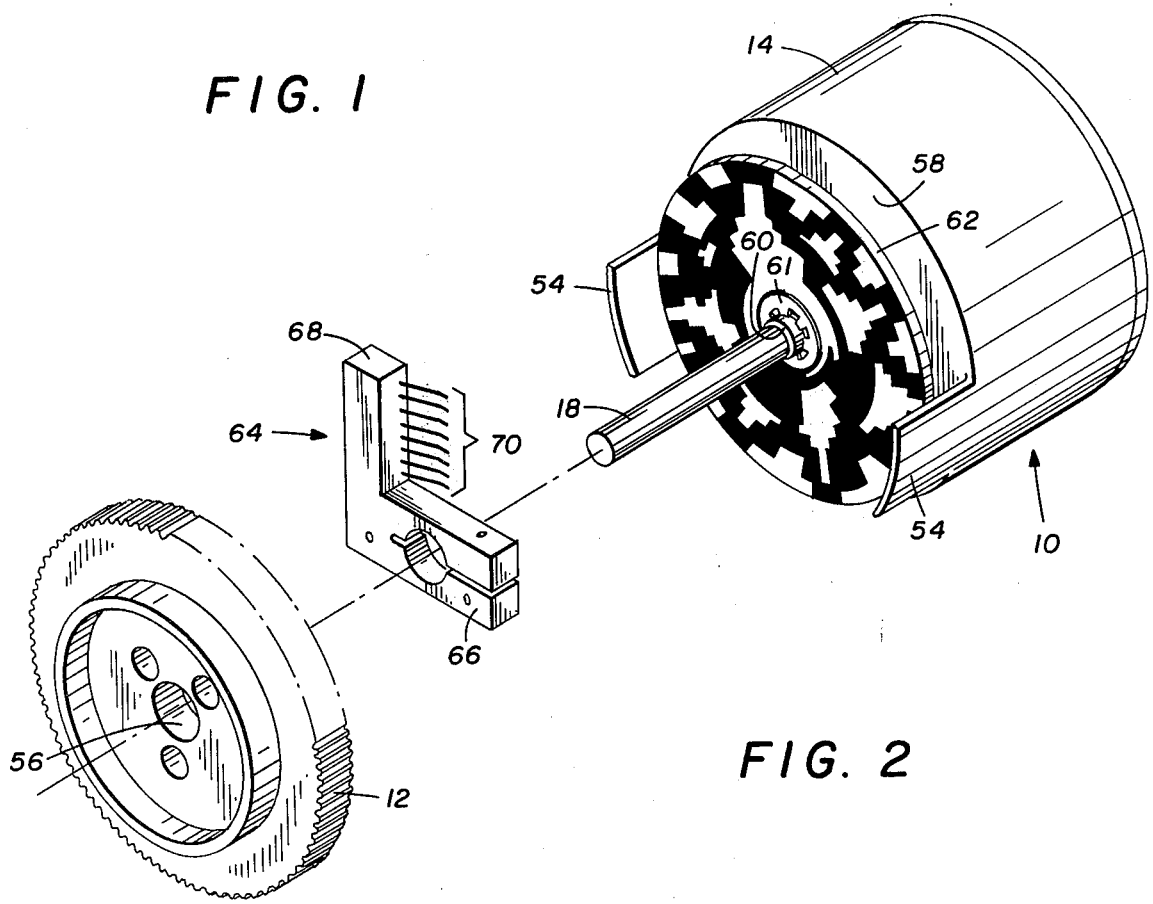
FIG. 2 is an exploded view of the altimeter of FIG. 1 with an encoding disc mounted for rotation on a supporting shaft.

Referring to FIG. 2, there is shown an exploded view of the altimeter 10 including a cylindrical capsule housing 14 with two axially extending sectors 54 supporting the ring gear 12. At the center of the ring gear 12 there is an opening 56 axially aligned with a passageway to the front plate 58 of the housing 14. Assembled at the passageway of the front plate 58 is a collar 60 that is mounted on the shaft 18 to thereby rotate with respect to the housing 14.

Mounted onto the collar 60 and secured in place by a spring washer 61 is a code disc 62 having seven code formations supported on the front surface. Each of these code formations has a generally circular configuration with alternate spaces of conducting and nonconducting sectors. The particular arrangement of conducting and nonconducting surfaces in each of the rings defines the code formations. In addition, the disc 62 supports an inner ring as a ground connection. All of the metallic conducting surfaces (shaded areas) of the various code formations are electrically interconnected to the ground ring.

Considering the arrangement of the code formations, the outer three rings relate to the least significant increments of altitude change. These outer three code formation rings repeat at 1000 foot intervals. Juxtapositioned these outer three rings are three additional rings of code formations relating to the next most significant increments of altitude change. Taken as a group, this second group of code formations repeats at 8000 foot intervals of altitude change. The seventh and innermost code formation on the disc 62 provides a reference code to encoding logic (to be described) to generate the most significant bit patterns. This innermost code formation has a metallic sector covering a 4000 foot change in altitude and a nonmetallic sector also covering a 4000 foot change of altitude.

Rigidly attached to a bushing (not shown) mounted in the opening 56 of the ring gear 12 is a brush assembly 64 including a brush holder 66 supporting on an extension arm 68 eight brush pickoffs 70. One of the brush pickoffs is associated with each of the code formations with the lowermost pickoff engaging the ground ring on the disc 62. Thus, the brush holder 66 is held stationary with respect to the housing 14.

Referring to FIG. 3, there is shown a block diagram of an altitude encoder including the code disc 62 with the brush pickoffs 70 in contact with code formations carried by the disc. The brush pickoffs for the outer three code formations are coupled respectively to isolation diodes 72, 74 and 76 to provide at output terminals the code bits $C_4$, $C_2$ and $C_1$ that comprise a bit pattern to identify the least significant changes in altitude. The code bits $C_4$, $C_2$ and $C_1$ comprise a pattern that repeats every 1000 feet of altitude change. The circuits for generating the pulse trains at the diodes 72, 74 and 76 are completed through the ground brush pickoff connected to a logic encoder 78 by means of a line 80.

Juxtapositioned the three least significant code formations are three additional code formations having individual brush pickoffs connected to isolation diodes 82, 84 and 86 to provide code bits $B_4$, $B_2$ and $B_1$. The individual pulse trains for the code bits $B_4$, $B_2$ and $B_1$ are again supplied by circuits completed through the brush pickoff connected to the line 80. The code bits $B_4$, $B_2$ and $B_1$ identify changes in altitude over the next most significant range above the code bits $C_4$, $C_2$ and $C_1$. The next most significant code bit pattern repeats 8000 foot intervals of altitude change. The seventh brush pickoff from the outer edge of the disc 62 is connected to the encoder logic 78 that generates code bits $A_4$, $A_2$, $A_1$ and $D_4$. These four code bits relate to the most significant changes in altitude and in combination with the code bits $C_4$, $C_2$, $C_1$, $B_4$, $B_2$ and $B_1$ comprise a bit pattern that uniquely identifies an altitude within a 40,000 foot range. Application Younkin.

In addition to receiving a reference code from the seventh brush pickoff, the encoder logic 78 also responds to two analog position voltages generated at the output terminals of an analog generator 88. The outputs of the generator 88 vary with aircraft altitude in accordance with a signal applied on a line 90 from an altimeter system such as described in the copending appkication of James R. younkin, Ser. No. 454,305.

In operation of the encoder of FIG. 1, a pressure responsive transducer within the housing 14 of the altimeter 10 controls a pickoff movement associated with a signal generator that provides a pressure change signal to a control system. The control system generates a pressure altitude signal for energizing the servomotor 20 that engages the drive gear 16 coupled to the rotational shaft 18. Rotating the shaft 18 also rotates the disc 62 and the individual code formations move with relation to the associated brush pickoffs.

On any one selected radius of the code disc 62, the brush pickoffs 70 will engage a pattern of conductive and nonconductive surfaces making up the seven code formations. The first six brush pickoffs from the circumference of the code disc 62 determine the code bits at the anodes of the isolation diodes 72, 74, 76, 82, 84 and 86. These code bits are manifest by either a high (voltage) or low (voltage) appearing at the terminals connected to the respective diodes. Thus, as the code disc 62 rotates, the six least significant code bits trace a series of square wave pulse trains.

The seventh brush pickoff as connected to the encoder logic 78 functions in conjunction with the two ramp voltages from the generator 88 to provide the most significant code bits. These code bits also are manifested by changes between a high and a low. Again, they appear as a square wave pulse train having a combined pattern related to a particular increment of altitude.

Referring to FIG. 4, there is shown a schematic of the encoder 78 wherein an analog position voltage (ramp voltage No. 1) from the generator 88 connects to the inverting input terminal of level detectors 92–95 as one of two such groups of level detectors in the encoder. A second analog position voltage (ramp voltage No. 2) of the generator 88 is connected to the inverting input terminal of level detectors 96–98 and the noninverting input terminal of a level detector 100.

In the input circuit of the level detectors 92 and 93 ramp voltage No. 1 is applied to input terminals through resistors 102 and 104, respectively. The level detectors 94 and 95 are direct coupled to the ramp voltage No. 1. Similarly, level detectors 97, 98 and 100 are direct coupled to the ramp voltage No. 2 while the level detector 96 is connected to the ramp voltage No. 2 through a resistor 106.

Also connected to each of the level detectors 92–95 is a reference voltage as established by a resistor ladder network including resistors 108–113, with the resistor 108 connected to the output of a regulated supply connected to a transistor 114 and the resistor 113 connected to ground. The level detectors 96–98 and 100, of the second group, also are supplied a reference voltage to an input terminal as established by a ladder network including resistors 116–120, with the resistor 116 connected to the transistor 114 and the resistor 120 connected to ground. Each of the level detectors 92–95 includes a resistor 122–125, respectively, in the input circuit from the established reference voltage. Similarly, each of the level detectors 96–98 and 100 includes a resistor 126–129, respectively, in the input circuit from the established reference voltage.

A reference code from the seventh brush pickoff is provided to the encoder 78 through a diode 130 and applied to the base electrode of a transistor 132 through a resistor 134. Included in the base drive circuit for the transistor 132 is a resistor 136 and a resistor 138, the former connected to the transistor 114 and the latter to ground. The output of the transistor 132 at the collector electrode is applied to the base electrode of a transistor 140 through a drive resistor 142. The output of the transistor 132 is also connected to the noninverting input terminal of the level detector 92 through a resistor 144, the noninverting input of the level detector 96 through a resistor 146, the noninverting inputs to the level detectors 94 and 98 through resistors 148 and 150, respectively, and to the emitter electrode of the transistor 152. The drive voltage to the transistor 132 is provided by the regulated supply connected to the transistor 114 through a resistor 152.

When conducting, the transistor 132 drives the transistor 140 that in turn provides an output to the level detector 95 through a resistor 154, the level detector 93 through a resistor 156 and the level detectors 97 and 100 through resistors 158 and 160, respectively. A drive voltage for the transistor 140 is provided at the transistor 114 through a resistor 162.

Each of the level detectors 92–95 and 96–98 is similarly interconnected. However, associated with the level detector 100 is a transistor network for providing the code bit $D_4$. This transistor network includes the transistor 152 and in addition transistors 164 and 166.

The code bit $D_4$ is generated at the collector electrode of the transistor 164 that has a grounded emitter electrode. The base electrode of the transistor 164 is coupled to the output of the level detector 100 through a resistor 168 and is biased from the transistor 114 through a resistor 170. Also biased by a connection to the transistor 114 is the transistor 152 through a resistor 172 and a diode 174 having a cathode connection to the base electrode of the transistor 152. An output of the transistor 152 at the collector electrode is applied to the base electrode of the transistor 166 through a resistor 176. The transistor 166 has an emitter electrode connected to the transistor 114 and a collector electrode tied to the noninverting input of the level detector 98.

Transistor 114 is part of a voltage switching circuit including a transistor 178 that provides a drive voltage to the levle detectors 97 and 100. Both the base electrodes of the transistors 114 and 178 are switched to ground with the former connected to ground through a resistor 180 in series with a diode 182. A base electrode of the transistor 178 connects to ground through a resistor 184.

Also forming a part of the encoder 78 is a switching transistor 186 connected to the system power supply through a resistor 188 and having a collector electrode connected to the line 80 of the ground brush pickoff of the code disc 62. The emitter electrode of the transistor 186 connects to ground through a diode 190. This circuit functions to monitor the encoder supply voltage. Upon a loss of the power supply, the transistor 186 goes nonconducting thereby opening the circuit between the ground brush pickoff and system ground. This renders the code formations on the disc 62 inoperative and thereby prevents false coded altimeter readings.

In operation of the encoder, the output of the brush pickoff for each of the outer six code formations of the disc 62 appears directly through the diode isolation network and from the isolation network to an air traffic control transponder for transmission to a ground station. These six brush pickoffs provide six bits of code information that repeats over each 8000 foot increment of altitude change. Higher order code bit information is generated electronically in the encoder logic 78 that provides a digitized output based on a pressure altitude voltage generated in the altimeter servosystem. This pressure altitude signal is applied to the generator 88 over the input line 90. Thus, the code formations on the disc 62 generate fine increments of digitized altitude and electronic circuitry provides a digitized output to be combined with the 8000 foot segments to uniquely identify a particular altitude.

The generator 88 provides two analog positon voltages to the encoder logic 78 that varies with presure altitude. These voltages are applied to the level detectors 92–95 and 96–98 and 100 to either open or close a switch as part of the detector circuitry to generate a code bit pattern.

Also as an input to the encoder logic 78 is the reference code provided by the seventh brush pickoff of the code disc 62. This reference code is connected to the transistors 132 and 140 to generate a pair of switching signals that have outputs 180° out of phase such that when one transitions high the other transitions low.

Considering ramp voltage No. 1, the magnitude of this voltage continually increases with altitude in accordance with the signal on line 90. In addition to the other level detectors 93–95, this ramp voltage is applied to the level detector 92 through the resistor 102. The level detector 92 also has a reference voltage applied to the noninverting input through resistor 122.

Level detectors of the type shown in FIG. 4 generate an output that changes states when the input signals applied to the inverting and noninverting input terminals satisfy a predetermined relationship. With regard to the level detector 92, the output changes states when the signal applied at the inverting input terminal is equal to the reference voltages applied to the noninverting terminal, that is, within normal error tolerances.

Assuming for purposes of description that the input circuit of the detector 92 including the resistor 144 is open, only two inputs are now applied to this detector through the resistors 102 and 122. As the ramp voltage No. 1 increases to a level such that the input signal of the inverting terminal of the detector 92 equals the reference voltage applied to the noninverting terminal, then the output of the detector changes states. However, due to the normal errors involved in the circuitry including the resistor ladder network, the detector 92, and the generator 88, there may be a significant tolerance errors as to when the output of the detector 92 changes states. Since it is necessary for the detector to change states at a predetermined altitude, this type of operation would introduce significant errors. The significance of such errors will be understood when it is remembered that the encoder generates information with a required degree of accuracy from about an altitude of 20 feet up to about 40,000 feet.

To minimize to the extent possible these sources of error, the reference code generated by the seventh brush pickoff is applied to the switching transistor 132. Assuming now that the circuit including the resistor 144 is complete, turning on the transistor 132 by the reference code adds a step input voltage to the reference voltage applied to the resistor 122 to the noninverting input terminal of the level detector 92. This significantly increases the noninverting input to the level detector 92 above the level at which the ramp voltage No. 1 should be when the first switching transition of the detector is to occur. Note, that the reference voltage applied to the detectors from the resistor ladder networks is at a value lower than where the detectors are programmed to transition.

Thus, as the ramp voltage No. 1 approaches the desired switching level for the detector 92, which represents an altitude of 2750 feet, the second input to the detector has been driven significantly higher by operation of the transistor 132. As the code disc 62 rotates to a position where the detector 92 is to transition, the seventh brush pickoff contacts a conducting area immediately switching off the transistor 132. This drives the noninverting input to the detector 92 to a level below the desired altitude switching. Since the ramp voltage No. 1 has increased to a level representing the selected switching altitude turning off the transistor 132 causes the inverting input terminal to the detector 92 to be significantly above the noninverting input and the detector transitions.

In summary of the operation of the detector 92, the reference voltage is biased above a desired switching point by operation of the transistor 132. The ramp voltage No. 1 increases with pressure altitude and is at a magnitude related to the first switching altitude. At that point, the reference code from the seventh brush pickoff switches the transistor 132 and the reference voltage drops below the ramp voltage and the detector transitions. Since the code formations on the disc 62 are accurately configured, the transition of the detector 92 at the first altitude level is accurately controlled. Thus, the detector 92 is forced to be accurate and a system that is inherently inaccurate has been made accurate by adding the reference code to control the transistor 132.

Transitioning the level detector 92 generates the code bit $A_4$ through the isolation diode 73.

As pressure altitude continues to increase, the ramp voltage No. 1 increases and eventually approaches the level for transitioning the level detector 93. The level detector 93 operates in a manner similar to the level detector 92. However, the step input addition to the noninverting input terminal of the level detector 93 is controlled by the transistor 140 through the resistor 156.

As previously described, the reference code on the seventh brush pickoff changes at 4000 foot increments of altitude. When the transition of the level detector 92 occurred, the transistor 132 switched to subtract the step voltage from the reference to the detector 92. Operation of the transistor 132 also switched the state of the transistor 140 to add a reference step to the voltage of the detector 93. Thus, as the ramp voltage No. 1 approaches the transition level for the detector 93, the reference voltage is significantly higher than desired. As the seventh brush pickoff changes from the nonconducting to the conducting segment of the code formation, the state of the transistors 132 and 140 switches thereby adding a step reference to the detector 92 and subtracting the step reference from the detector 93. The detector 93 immediately transitions to generate the code bit $A_2$ through the isolation diode 75.

Note, that the detector 92 does not transition to its original state at this time. The step reference added to each of the level detectors represents a relatively small increment of altitude change. As the ramp voltage No. 1 increases with pressure altitude, when the detector 93 is ready to transition the voltage applied to the inverting input terminal of the detector 92 through the resistor 102 exceeds by some amount the reference voltage as generated by the ladder network plus the step reference added through the resistor 144. Thus, when the transistor 132 again switches in the step reference to the detector 92, the signal to the inverting input terminal is greater than the reference voltage to the noninverting terminal and the detector 92 remains in the transition state.

Figure 6:
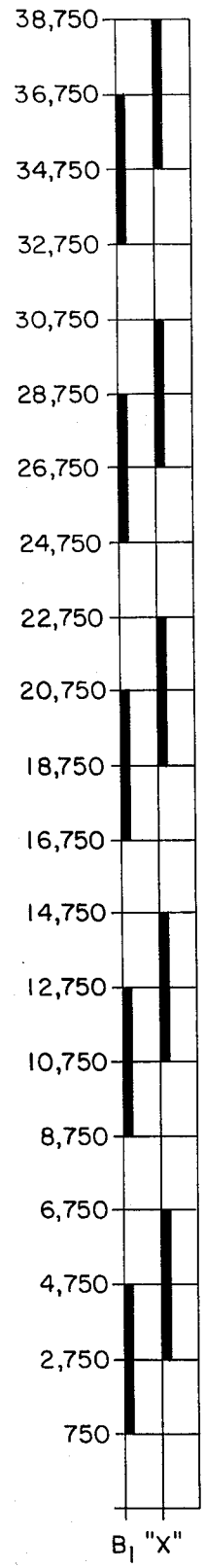
FIG. 6 is an expanded scale of the code $B_1$ of FIG. 5 and a reference code supplied to the encoder logic of FIG. 3.
Figure 7:
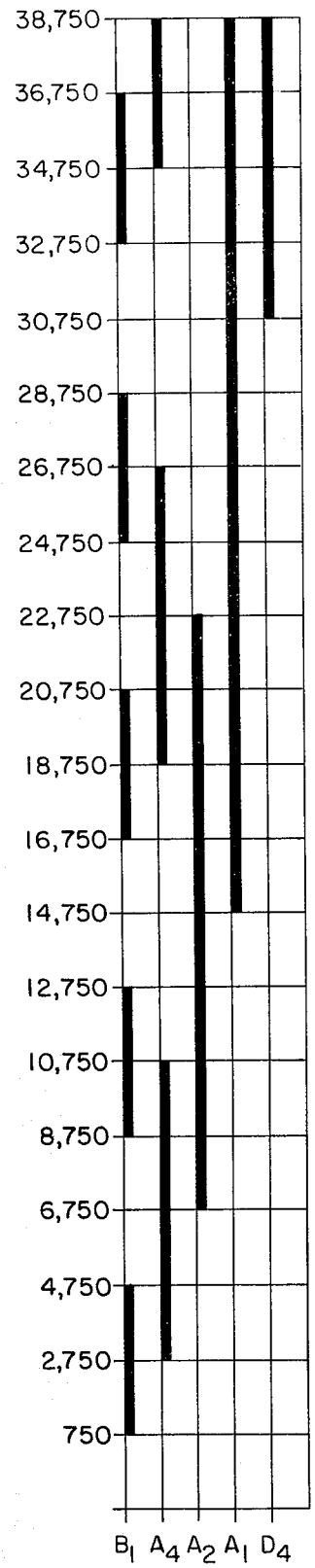
FIG. 7 is also an expanded scale of the chart of FIG. 5 showing the most significant code bit patterns, these patterns are referenced to the code bit $B_1$ for altitudes from 750 feet to 38,750 feet.

Referring to FIGS. 6 and 7, the reference code (X) switches between state 1 and state 2 at an altitude of 2750 feet. At this altitude, the code bit $A_4$ is generated as shown by the bar of FIG. 7. Code bit $A_4$ is generated and continues so long as the detector 92 is in a transition state. At an altitude of 6750 feet, the reference code X again switches to the first state and the code bit $A_2$ is generated by transitioning the detector 93. Thus, at the 6750 foot level both the code bits $A_4$ and $A_2$ are generated.

The ramp voltage No. 1 continues to increase with pressure altitude and applied to the level detector 94. At the 6750 foot altitude level, the transistors 132 and 140 switched to subtract the reference step from the detector 93 and apply a reference step to the noninverting input terminal of the level detector 94. This drives the reference voltage to this detector above the required switching level.

When the code disc 62 rotates through another 4000 foot increment of altitude, that is, at an altitude of 10,750 feet, the reference code again switches to state 2, as shown by FIG. 6, and the step reference is subtracted from the noninverting input terminal of the detector 94. At this time ramp voltage No. 1 is at a level representing 10,750 feet and the detector 94 immediately transitions. When the level detector 94 transitions, it switches low and the output is connected to the inverting input terminal of the detector 92. This drives the noninverting input terminal of the detector 92 below the reference level and the detector switches to its original state. The code bit $A_4$ is cut off as shown by FIG. 7. At this altitude only the code bit $A_2$ is generated by the encoder logic.

After another 4000 foot change in altitude, that is, at 14,750 feet, the level detector 94 transitions to generate the code bit $A_1$ as shown in FIG. 7.

Figure 5:
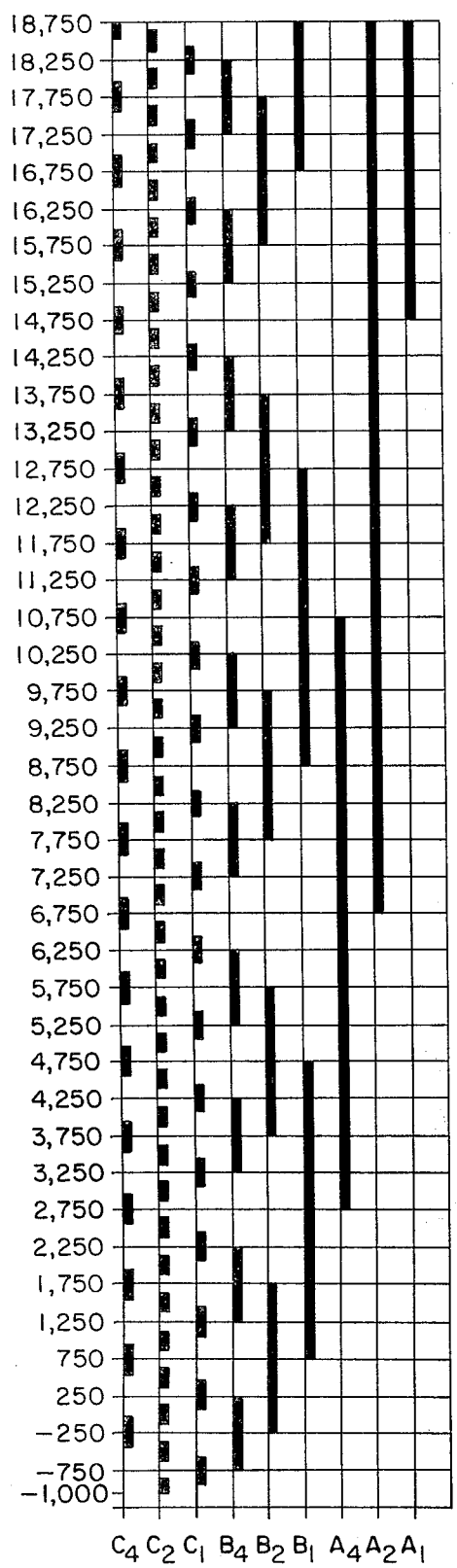
FIG. 5 is a chart showing the code bit patterns for identifying increments of altitude from −1000 feet to 18,750 feet.

As pressure altitude changed from 2750 to 14,750 feet the code bits $C_4$, $C_2$, $C_1$, $B_4$, $B_2$ and $B_1$ changed in the pattern as shown in FIG. 5. Thus, at any particular altitude a code bit pattern is generated at the output of the isolation diode network to uniquely define an altitude.

Sometime after the pressure altitude signal on the line 90 to the generator 88 exceeds an altitude of 14,750 feet, the ramp voltage No. 1 saturates and remains at the saturated level until the pressure altitude again decreases to slightly above the 14,750 foot level. Up to this point, the code bit $A_4$ has been turned on and turned off once. The code bit $A_2$ has been turned on and is in that state. Finally, the code bit $A_1$ has been turned on and as shown in FIG. 7 will remain on within the range of altitude being encoded.

At the altitude where the ramp voltage No. 1 saturates, the ramp voltage No. 2 is increasing with altitude pressure, and is applied to one input terminal of the level detectors 96–98 and 100. This group of level detectors 96–98 functions basically the same as the detectors 92–95. Operation of the transistors 132 and 140 switches in and out of step reference to accurately control the transitioning of the detectors 96–98 and 100.

At an altitude 4000 feet above the switching of the level detector 95, that is, at an altitude of 18,750 feet, the reference code again changes states and the level detector 96 transitions to again generate the code bit $A_4$ as illustrated in FIG. 7. The ramp voltage No. 2 continues to increase and at an altitude of 22,750 feet the reference code bit X again switches and the level detector 97 transitions. When the level detector 97 transitions, the output as connected to the inverting input terminal of the detector 93 causes this detector to transition. This results in the bit code $A_2$ turning off as illustrated in FIG. 7 at the altitude of 22,750 feet. A further 4000 foot increase in altitude pressure, that is, at an altitude of 26,750 feet, a reference code X again switches causing the level detector 98 to transition. The output of the level detector 98 is connected to the inverting input terminal of the level detector 96. Transitioning of the level detector 98 causes the level detector 96 to revert to its original state and the code bit $A_4$ is again turned off.

Again with reference to FIG. 5, the code pattern for the code bits $C_4$, $C_2$, $C_1$, $B_4$, $B_2$ and $B_1$ continues to repeat such that at any given altitude a particular code bit pattern exists at the isolation diode network to uniquely identify a particular altitude. Although the code pattern for the first six bits as given in FIG. 5 extends only to 18,750 feet, it should be understood that these patterns continually repeat. The code pattern for the bits $C_4$, $C_2$ and $C_1$ repeat at 1000 foot increments of altitude change while the bit pattern for the code bits $B_4$, $B_2$ and $B_1$ repeat at 8000 foot increments of altitude change.

To reference the two code charts of FIGS. 5 and 7, the bit pattern for code bit $B_1$ is repeated in FIG. 7. To associate the lower six bit pattern with the bit patterns for the code bits $A_4$, $A_2$ and $A_1$, consider the altitude increment from 8750 feet to 16,750 feet as given in FIG. 5. This bit pattern for the six lowest code bits will be repeated between 16,750 feet of altitude and 24,750 feet of altitude. It will again be repeated between 24,750 feet and 32,750 feet. The bit pattern will also repeat above 32,750 feet to the limit of the embodiment of the encoder described.

Considering now the operation of the level detector 100 and the associated transistor switching network, the ramp voltage No. 2 is connected to the noninverting input terminal and the reference voltage is applied to the inverting input terminal. This is the reverse order from the other level detectors of the encoder logic. At an altitude of 30,750 feet the reference code bit X again switches and the level detector 100 transitions.

However, the transitioning of the detector 100 is of a reverse order when considering the transitioning of the remaining detectors. That is, the other detectors of the encoder logic transition from high to low, while the detector 100 transitions from low to high.

The level detector 100 is to generate the code bit $D_4$ and the last transition of the code bit $A_4$. Generating the code bit $D_4$ is accomplished by transitioning the level detector 100 into a high state to turn on the transistor 164. This produces the code bit $D_4$ at the collector electrode of the transistor 164 at an altitude of 30,750 feet, as illustrated in FIG. 7.

With the high output at the level detector 100, a voltage substantially above ground is generated at the junction of the resistors 168 and 170. This positive voltage is applied to the base of the transistor 152 that has an emitter electrode tied to the transistor 132. The transistor 132 has switched to provide a positive voltage at the emitter electrode of the transistor 152 when the detector 100 transitions to the high state. Thus, the transistor 152 is biased off.

Now at the altitude of 34,750 feet, the transistor 132 again switches states by a change in the reference code X as shown in FIG. 6. The transistor 152 now becomes forward biased. When the transistor 152 conducts, it forward biases the transistor 166 to turn on and conduct heavily. The collector electrode of the transistor 166 connects to the noninverting input terminal of the detector 98 thereby connecting this terminal to the transistor 114. This causes the level detector 98 to transition, and as explained previously, by an interconnection to the level detector 96 causes the code bit $A_4$ to transition, as shown in FIG. 7.

It should be noted, that at the time the transistor 152 switches on by operation of the transistor 132, the ramp voltage No. 2 has increased to a level such that the level detector 100 does not again transition. This operation is the same as explained with regard to detector 92.

Referring to FIGS. 5, 6 and 7, the first six code formations generate the first six code patterns of FIG. 5. These patterns repeat at the intervals shown and continue above the 18,750 foot limit of FIG. 5. Also shown in FIG. 5 are the code bits $A_4$, $A_2$ and $A_1$ as generated by the encoder logic. The electronically generated code bits are produced at the outputs of the level detectors 92–95, 96–98 and 100 at altitudes determined by the ramp voltage No. 1 and ramp voltage No. 2 and the reference code X as generated by the seventh brush pickoff. This reference code X changes at 4000 foot intervals as illustrated in FIG. 6.

It will be understood that the altitude encoder as described may be implemented for other altitude ranges than those illustrated in FIGS. 5–7. The code patterns and altitude levels given in these Figures are intended to be by way of example only, and not by way of limitation.

While only one embodiment of the invention, together with modifications thereof, has been described in detail herein and shown in the accompanying drawings, it will be evident that various further modifications are possible without departing from the scope of the invention.

What is claimed is:

1. A position encoder, comprising in combination:
   code support means positionable in accordance with physical input information;
   a first group of a plurality of code formations carried by said support means, the code formations changing at selected intervals of movement of the support means and providing switching signals;
   at least one additional group of a plurality of code formations also carried by said support means, the code formations of the at least one additional group changing at selected intervals of movement of the support means;
   means responsive to the code formation of the at least one additional group of code formations to provide a first series of code bit patterns varying in accordance with the input information;
   means for generating a control voltage that varies in accordance with the physical input information; and
   encoder logic receiving the control voltage at one input and responsive to the switching signals of the first group to provide a second series of code bit patterns varying in accordance with the input information to uniquely identify a physical input in association with the first series of code bit patterns.

2. A position encoder as set forth in claim 1 wherein said encoder logic includes a plurlity of level detectors interconnected to be actuated in a preordered sequence as the control voltage varies and in response to the switching signals to provide the second series of code bit patterns.

3. A position encoder as set forth in claim 2 wherein said encoder logic further includes means for presetting the actuation of each of the plurality of level detectors.

4. A position encoder as set forth in claim 3 wherein said level detectors each comprise a voltage comparator having one input responsive to the control voltage and said means for presetting includes:
   a reference voltage network for generating a reference voltage to a second input of each of said comparators; and
   circuit means responsive to the switching signals of said first group to step change the reference voltage to said comparators in accordance with the physical input information.

5. An altimeter encoder, comprising in combination:
   code support means positionable in accordance with altitude pressure;
   a first group of a plurality of code formations carried by said support means, the code formations changing at selected intervals of movement of the support means and providing switching signals at selected altitudes;
   at least one additional group of a plurality of code formations also carried by said support means, the code formations of the at least one additional group changing at selected intervals of movement of the support means;
   circuit means responsive to the code formations of the at least one additional group of code formations to provide a first series of code bit patterns varying in accordance with altitude pressure;
   an altitude voltage generator providing a pressure voltage varying with altitude pressure; and
   encoder logic receiving the pressure voltage at one input thereof and responsive to the switching signals of the first group to provide a second series of code bit patterns varying in accordance with altitude pressure to uniquely identify an altitude in association with the first series of code bit patterns.

6. An altimeter encoder as set forth in claim 5 wherein said code support means comprises a disc mounted to rotate by drive means actuated in accordance with changes in altitude pressure.

7. An altimeter encoder as set forth in claim 5 wherein the at least one additional group of code formations includes:
   a least significant increment group having three code formations that provide a code bit pattern that repeats at one thousand foot intervals of altitude pressure change.

8. An altimeter encoder as set forth in claim 7 wherein the at least one additional group of code formations includes:
   a most significant group having three code formations that provide a code bit pattern that repeats at eight thousand foot intervals of altitude pressure change.

9. An altimeter encoder as set forth in claim 8 wherein the first group of code formations includes a code formation that changes at each four thousand foot interval of altitude pressure change.

10. An altimeter encoder as set forth in claim 5 wherein said code support means comprises a disc mounted to rotate by a drive means actuated in accordance with changes in altitude pressure, and each group of code formations includes a circular pattern of conducting and nonconducting sectors juxtapositioned with the conducting sectors of adjacent groups interconnected to a ground conductor.

11. An altimeter encoder as set forth in claim 10 wherein said circuit means comprises a brush pickoff for each of the at least one additional group of code formations.

12. An altimeter encoder as set forth in claim 11 wherein said encoder logic includes a brush pickoff for each code formation of the first group to provide switching signals varying with altitude pressure change.

13. An altimeter encoder, comprising in combination:
- code support means positionable in accordance with altitude pressure;
- a first group of a plurality of code formations carried by said support means, the code formations changing at selected intervals of movement of the support means and providing switching signals at selected altitudes;
- at least one additional group of a plurality of code formations also carried by said support means, the code formations of the at least one additional group changing at selected intervals of movement of the support means;
- circuit means responsive to the code formations of the at least one additional group of code formations to provide a first series of code formations varying in accordance with altitude pressure;
- a generator providing a first pressure voltage varying with altitude pressure up to an established altitude and providing a second pressure voltage varying with altitude pressure above the established altitude; and
- encoder logic receiving the first and second pressure voltages at first and second inputs and responsive to the switching signals of the first group to provide a second series of code bit patterns varying in accordance with altitude pressure change to uniquely identify an altitude in association with the first series of code bit patterns.

14. An altimeter encoder as set forth in claim 13 wherein said encoder logic includes a first plurality of level detectors responsive to the switching signals of the first group and the first pressure voltage of said generator to be actuated in a first preordered sequence as the code formation of the first group changes, and a second plurality of level detectors also responsive to the switching signals of the first group and the second pressure voltage of said generator to be actuated in a preordered sequence subsequent to the first preordered sequence as the code formation of the first group changes, the first and second plurality of level detectors providing the second series of code bit patterns.

15. An altimeter encoder as set forth in claim 14 wherein said encoder logic further includes:
- a reference voltage network for generating a reference voltage to each of said level detectors; and
- switching means responsive to the switching signals of said first group to step change the reference voltage to said level detectors between two voltage levels in accordance with altitude pressure changes.

16. An altimeter encoder as set forth in claim 15 wherein each said level detector comprises a voltage comparator with one terminal of each comparator of the first plurality connected to the first pressure voltage of said generator and one terminal of each comparator of the second plurality connected to the second pressure voltage of the generator.

17. An altimeter encoder as set forth in claim 16 wherein said reference voltage network provides a voltage to each of the voltage comparators at a level related to an altitude pressure.

18. An altimeter encoder as set forth in claim 17 wherein said switching means responds to the switching signals of the first group to change the reference voltage connected to the voltage comparators.

19. A position encoder logic network responsive to a control voltage varying in accordance with physical input information, comprising in combination:
- a first reference voltage network generating a plurality of reference voltages of increasing magnitude;
- a first plurality of level detectors each having a first input responsive to one of the reference voltages and a second input responsive to the control voltage;
- a second reference voltage network generating a second plurality of reference voltages of increasing magnitude;
- a second plurality of level detectors each having a first input responsive to one of the second reference voltages and a second input responsive to the control voltage; and
- means for switching the reference voltage at the first terminal of each level detector a fixed increment from the generated magnitude to transition selected detectors from a first output level to a second output level.

20. A position encoder logic network as set forth in claim 19 wherein each said level detector comprises a voltage comparator with the first terminal of each comparator connected to one of the reference voltages and the second terminal responsive to the control voltage.

21. A position encoder logic network as set forth in claim 19 including means for selectively interconnecting the outputs of level detectors in the first and second pluralities to the input of other level detectors to control the transitioning between output levels.

* * * * *